United States Patent [19]
Sloan, Jr.

[11] 4,075,039
[45] Feb. 21, 1978

[54] INTEGRATED LOGIC CIRCUIT AND METHOD OF FABRICATION
[75] Inventor: Benjamin Johnston Sloan, Jr., Richardson, Tex.
[73] Assignee: Texas Instruments Incorporated, Dallas, Tex.
[21] Appl. No.: 719,024
[22] Filed: Aug. 30, 1976

Related U.S. Application Data
[62] Division of Ser. No. 588,255, June 19, 1975.
[51] Int. Cl.² .......................................... H01L 21/26
[52] U.S. Cl. .................................. 148/1.5; 148/187; 357/44; 357/46
[58] Field of Search .................. 148/1.5, 187; 357/44, 357/46

[56] References Cited
U.S. PATENT DOCUMENTS
3,823,353  7/1974  Berger et al. ......................... 357/44
3,962,717  6/1976  O'Brien ................................. 357/46

Primary Examiner—G. Ozaki
Attorney, Agent, or Firm—James T. Comfort; Gary C. Honeycutt

[57] ABSTRACT

An integrated injection logic circuit having improved operating characteristics is provided, comprising an inverted, multiple-collector transistor having base regions characterized by a central active portion surrounded by a heavily-doped extrinsic base region to which the base contact is made. Using ion implantation, each active portion of the base region is provided with a dopant concentration which increases with distance from the collector junction, thereby increasing transistor speed and gain. The extrinsic portion of the base reduces series resistance for multicollector transistors, provides heavy doping at the surface for good ohmic base contacts; and most importantly, defines the active emitter-base regions. The effective or "active" collector-to-emitter area ratio of the device is improved by more than 50:1 compared with prior devices.

4 Claims, 7 Drawing Figures

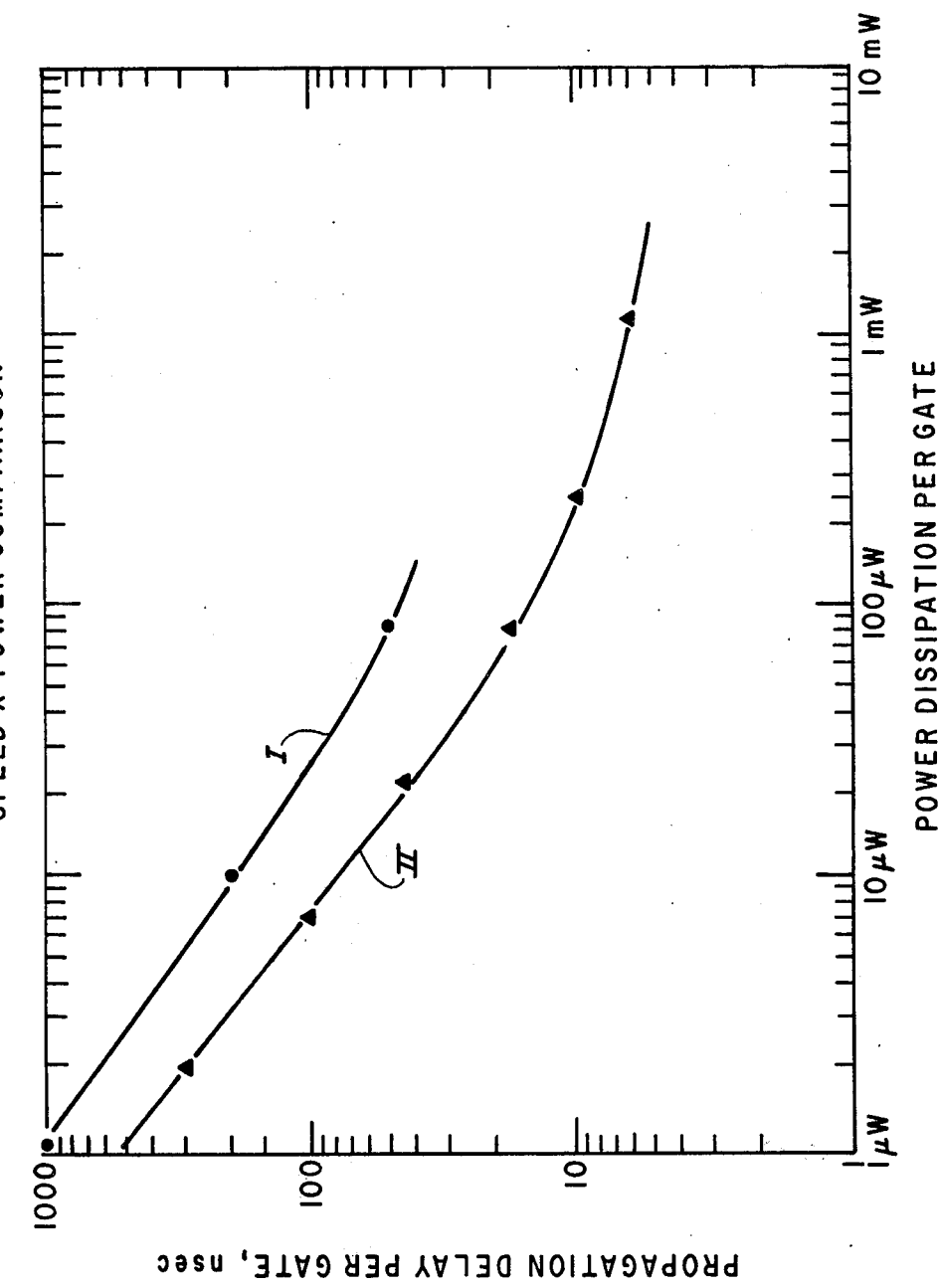

INTEGRATED LOGIC CIRCUIT AND METHOD OF FABRICATION

This is a division of application Ser. No. 588,255, filed June 19, 1975.

This invention relates to microelectronic semiconductor circuits, and more particularly, to an integrated injection logic device having a unique junction geometry, and to a method for its fabrication.

Integrated injection logic (I²L) is basically a circuit configuration utilizing a lateral pnp transistor in combination with an inverted, multiple-collector npn vertical transistor to achieve high packing density and a very low speed-power product. The previously known devices have several disadvantages including low inverse npn current gain, low collector-base breakdown voltage, and high collector-base capacitance.

The low inverse gain is due to a very unfavorable collector-to-emitter area ratio, a low emitter efficiency, and a drift field in the base which causes the drift and diffusion components of electron current to go in opposite directions. The high collector-base capacitance and low breakdown voltage are due to the location of the collector in the heavily-doped surface portion of a diffused base profile.

In accordance with the present invention, these difficulties are overcome by the use of an ion implanted base region to reverse the direction of the concentration gradient characteristic of a diffused device, and by the use of a heavily-doped peripheral base region which surrounds and defines the active emitter-base region. As a result, the forward emitter-base current density is concentrated primarily in the active region.

In a preferred embodiment, the device of the invention includes a low-resistivity monocrystalline silicon substrate emitter of one conductivity type having a high-resistivity surface layer of the same conductivity type, preferably formed by epitaxial growth, wherein the collector-base regions are defined. A plurality of lightly-doped regions of opposite conductivity type in the epitaxial layer form emitter-base junctions with the substrate, which are defined by a surrounding region of low resistivity, also of opposite conductivity type, which extends through the complete thickness of the epitaxial layer. A like plurality of regions of said one conductivity type and high resistivity are located above the lightly-doped regions of opposite conductivity type, to form collector-base junctions therewith. In order to avoid parasitic interaction between adjacent devices, the junction geometry just described is surrounded by a guard-ring of said one conductivity type surrounding the peripheral, low-resistivity region of opposite conductivity type.

Normally, an ion-implanted region has a concentration profile which begins at the surface of the implanted structure, peaks at a depth determined by the implantation energy, and then decreases to extinction at the maximum depth of penetration. Background doping levels of opposite conductivity type can readily offset or compensate the upper and lower portions of the implanted profile, leaving effectively only the peak portion of the implant totally buried below the surface, thereby forming upper and lower p-n junctions. However, when the background doping level is low, as in the present device, unusually high implant beam energies are required in order to obtain a totally buried region having useful upper junction characteristics at a sufficient depth to be commercially feasible for device fabrication. Equipment for the generation of such high beam energies has only recently become available.

Using such high energies, it is preferred in accordance with the invention to implant the base regions of the inverted npn transistor completely below the surface of the epitaxial layer, thereby leaving shallow multiple-collector regions of original epitaxial doping. Such a feature enables one to thereby form in a single step the emitter-base junctions at the substrate-epitaxial interface while also forming the collector-base junctions at the upper boundary of the implanted region thereby providing approximately a 1:1 collector-to-emitter area ratio and a drift field in the base region which optimizes inverse transistor gain.

FIG. 7 is a graphical comparison of the speed-power products of the inventive device vs. prior I²L devices.

Figure 1:
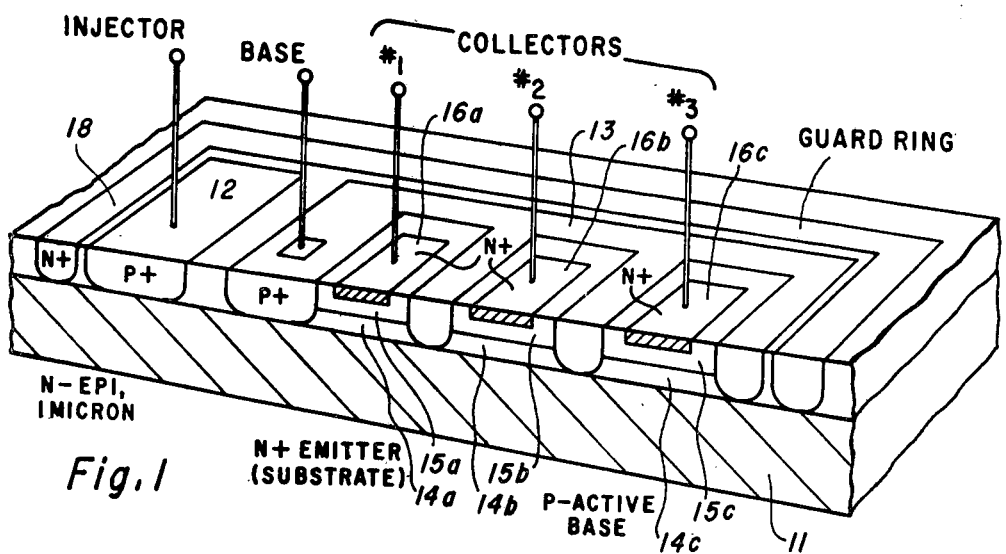
FIG. 1 is an enlarged perspective view, partly in section, of a semiconductor device embodying the device of the invention.

In FIG. 1, the preferred embodiment is seen to consist of an n+ substrate 11 having a resistivity of 0.005-0.05 ohm-cm. which functions as the emitter of a vertical, inverted, multi-collector npn transistor, and an n, 1-micron-thick epitaxial layer 12 having a resistivity of 0.3-1.0 ohm-cm. wherein the remaining active regions are formed. The base regions of the inverted npn-transistor are surrounded and defined by p+ region 13 which forms the inactive, or extrinsic, portion of the base. This layer has a sheet resistance of 25-50 ohms per square, which significantly reduces series base resistance, and provides heavy doping at the surface for good ohmic contact. The active base regions 14a, 14b and 14c are formed by a high-energy, low-dose boron implant of about $10^{13}$ ions/cm². Beam energies of 400-600 kev are preferred.

The heavily doped p+ extrinsic base has two important functions: (1) the p+ limits the voltage difference between different parts of the base due to base current and thus provides more nearly equal forward, emitter-base bias voltage throughout a multiple collector implanted gate, and (2) the current density from the emitter into the p+ is is much lower than emitter into p− at the same emitter-base forward voltage. Thus the p+ limits the region of significant current injection to that region immediately below a collector and decreases the ratio of effective emitter area to effective collector area by up to 50 times compared to conventional I²L because in a practical device design the extrinsic base area can be up to 50 times larger than the active, or intrinsic, base area.

Collector regions 15a, 15b and 15c correspond essentially to the original epitaxial layer 12. n+ regions 16a, 16b and 16c are contact enhancement zones having a sheet resistance of 50-100 ohms per square for facilitating ohmic contact to the collector regions. Note particularly that this configuration provides collector-base junctions having an area essentially equal to the emitter-base junctions, which represents as much as a 50:1 improvement over prior devices, and is responsible for a major increase in current gain.

Lateral *pnp* transistor action is provided by injector region 17 in combination with *p*+ region 13 separated by a portion of epitaxial layer 12. Regions 17 and 13 are spaced as closely as possible, i.e, 0.2-0.5 mil.

The unit cell is surrounded and isolated from adjacent cells by guard-ring 18 having a sheet resistance of above 15 ohms per square, which preferably extends through the complete thickness of epitaxial layer 12. However, it is not essential for most purposes that the guard-ring be as deep as shown in this embodiment.

Figure 2:
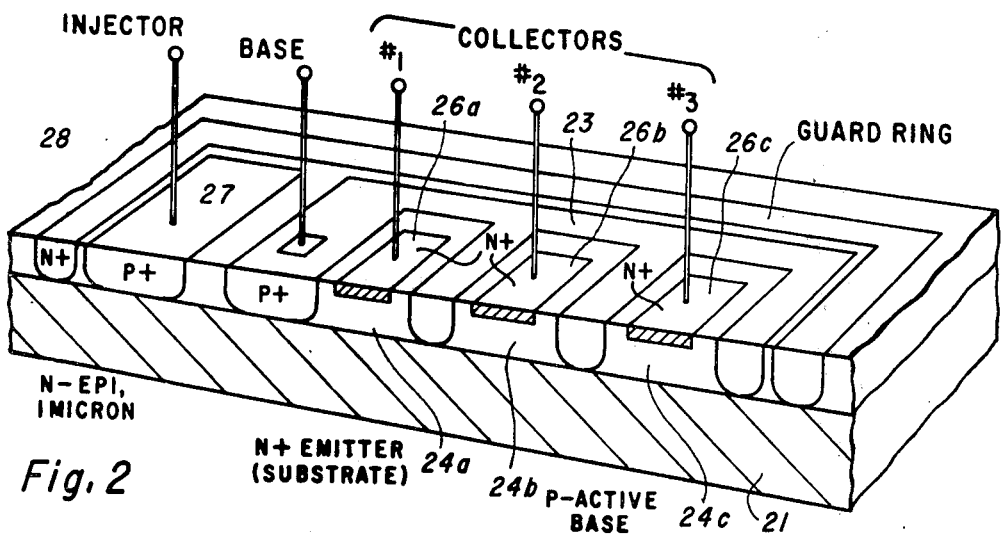
FIG. 2 is also an enlarged perspective view, partly in section, of a semiconductor device embodying an alternate junction geometry of the invention.

In FIG. 2, an alternate embodiment of the invention is seen to include an *n*+ substrate 21, an epitaxial layer 22, an extrinsic base 23 and injector 27. It differs from the embodiment of FIG. 1 solely in that the active base regions 24*a*, 24*b* and 24*c* extend to the surface of the slice thereby limiting the area of the collector base junction to that provided by *n*+ regions 26*a*, 26*b* and 26*c*. Although the resulting ratio of collector-base junction area to emitter-base junction area is thereby reduced, compared with the embodiment of FIG. 1, it is nevertheless a substantial increase with respect to prior devices. Of course, in the event that available ion beam energies are not sufficient to provide the penetration depth necessary to fabricate the embodiment of FIG. 1, then the best remaining option will be the embodiment of FIG. 2, which can readily be achieved with energies below 400 kev.

Figure 3:
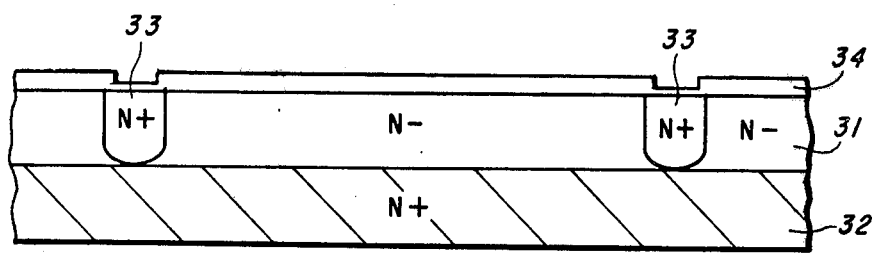
FIGS. 3-6 are enlarged cross-sectional views of a semiconductor structure illustrating the preferred process sequence for fabrication of the device of FIG. 1.

As shown in FIG. 3, a preferred process embodiment of the invention begins with the epitaxial growth of layer 31, having a resistivity of 1 to 2 ohm-cm. and a thickness of approximately 1-2 microns, upon substrate 32 which is doped to 0.005-0.05 ohm-cm., and preferably about 0.01 ohm cm., with antimony or arsenic. Next, the guard-ring 33 is formed by phosphorous or other diffusion or implantation through the complete thickness of layer 31 to provide heavy *n*+ doping.

Figure 4:
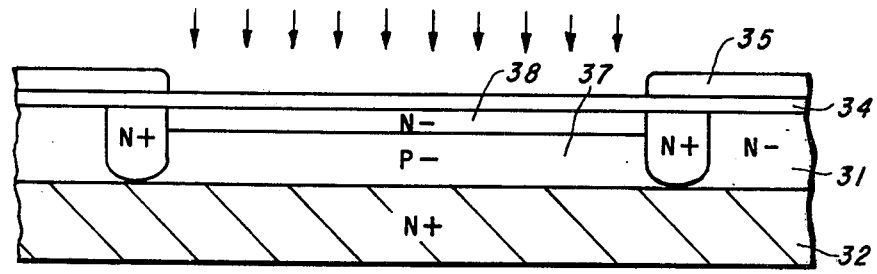

Next, as shown in FIG. 4, a selective mask 35 is patterned atop oxide layer 34 to provide apertures 36 for selective boron implantation at an energy level sufficient to provide peak boron concentration near the interface between epitaxial layer 31 and substrate 32, thereby forming the active base region 37 while leaving a surface region 38 of epitaxial layer 31 having essentially the original epitaxial characteristics; i.e., unchanged by the boron implant. No oxide removal is required, as the implant is made through the oxide.

Figure 5:
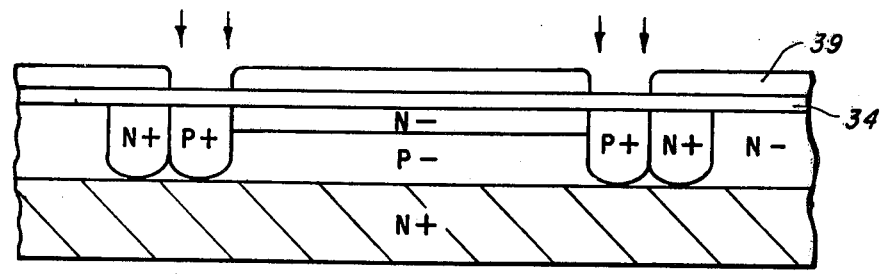

Next, as shown in FIG. 5, a new mask 39 is patterned atop oxide layer 34 for selective diffusion or implantation to form a heavily doped *p*+ region having a sheet resistance of 25-50 ohms per square, which significantly reduces the series base resistance and defines the active emitter base region. This region also extends to the interface between epitaxial layer 31 and substrate 32. Although not shown in FIG. 5, an injector region such as region 17 of FIG. 1 may also be formed simultaneously with extrinsic base region 41.

Figure 6:
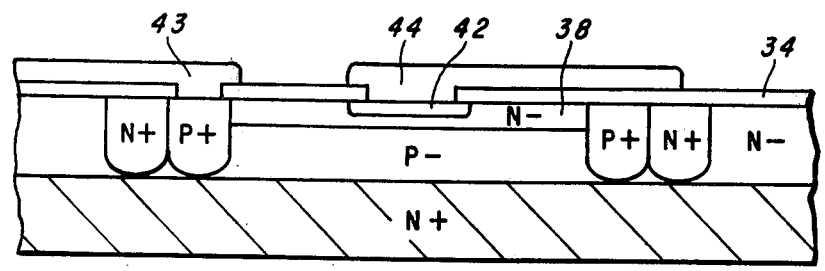

Next, as shown in FIG. 6, a collector contact region 42 is formed within region 38 followed by the patterning of oxide layer 34 to provide openings for the formation of ohmic contacts 43 and 44, thereby completing the device.

In an alternative embodiment, the collector junctions are formed by metal-semiconductor Schottky barriers, which further increase the speed of the device.

In FIG. 7, the operating characteristics of a five-collector device corresponding to FIG. 1 are compared with the operating characteristics of a prior device having a single uniform base region, diffused instead of implanted. Curve I is obtained with the prior device, showing failure to operate at power levels above 100 $\mu$W per gate, which corresponds to a propagation delay of 50 microseconds. Curve II is obtained with the device of the invention, showing operation at power levels up to 1 mW and a delay of only 6 nanoseconds.

What is claimed is:

1. A method for the fabrication of an integrated semiconductor injection logic device comprising the steps of:
   a. forming a monocrystalline epitaxial layer of N type conductivity and a thickness of about 1-2 microns having a resistivity of about 0.3-2 ohm centimeter on an N type monocrystalline silicon substrate having a resistivity of 0.005-0.05 ohm centimeter;
   b. forming on said surface layer an N type guard ring of low resistivity completely surrounding a portion of said surface layer;
   c. selectively exposing said portion to a beam of boron ions having an energy of 400 to 600 KEV and a dosage of about $10^{13}$ ions/cm$^2$ thereby forming a band of P type material below the surface of said epitaxial layer;
   d. selectively forming first and second P type regions having a sheet resistance of 25 to 50 ohms per square in said epitaxial layer, spaced apart sufficiently close at the surface to form the emitter and collector respectively of a lateral bipolar transistor, said collector having a repeated pattern of segments which extend through the thickness of said epitaxial layer to define and separate a plurality of epitaxial regions, including a like plurality of segments of said previously implanted P type band below the surface of said epitaxial layer; and
   e. forming ohmic contacts to said emitter and collector respectively of said lateral bipolar transistor and forming ohmic contacts to each of the repeated segments defined by said collector to complete the device.

2. A method as in claim 1 wherein said low-resistivity region formed in step (b) extends through the complete thickness of the surface layer.

3. A method as in claim 1 wherein the beam energy in step (c) is sufficiently high to cause the implanted region to be completely buried below the surface of said surface layer.

4. A method as in claim 1 wherein the beam energy of step (c) is not sufficiently high to avoid shallow surface implantation and wherein step (e) is achieved by selectively diffusing impurities into said implanted region.

* * * * *